United States Patent
Mahler et al.

(10) Patent No.: US 7,847,375 B2
(45) Date of Patent: Dec. 7, 2010

(54) ELECTRONIC DEVICE AND METHOD OF MANUFACTURING SAME

(75) Inventors: Joachim Mahler, Regensburg (DE); Ralf Wombacher, Maxhuette-Haidhof (DE); Ralf Otremba, Kaufbeuren (DE)

(73) Assignee: Infineon Technologies AG, Neubiberg (DE)

( * ) Notice: Subject to any disclaimer, the term of this patent is extended or adjusted under 35 U.S.C. 154(b) by 143 days.

(21) Appl. No.: 12/185,829

(22) Filed: Aug. 5, 2008

(65) Prior Publication Data

US 2010/0032816 A1 Feb. 11, 2010

(51) Int. Cl.
*H01L 23/495* (2006.01)

(52) U.S. Cl. .................. 257/666; 257/782; 257/678; 257/679; 257/716; 257/733; 257/787; 257/796; 257/795; 257/788; 257/E23.001; 257/E23.194; 257/E21.502; 257/E23.031; 257/E23.019

(58) Field of Classification Search ......... 257/678–733, 257/787–796, E23.001–23.194, 782, E21.502, 257/E23.031, E23.019, 666; 438/124
See application file for complete search history.

(56) References Cited

U.S. PATENT DOCUMENTS

| | | | | |
|---|---|---|---|---|
| 5,084,753 A | | 1/1992 | Goida et al. | |
| 5,250,843 A | * | 10/1993 | Eichelberger | 257/692 |
| 5,352,632 A | * | 10/1994 | Sawaya | 29/827 |
| 5,792,676 A | * | 8/1998 | Masumoto et al. | 438/111 |
| 6,072,243 A | | 6/2000 | Nakanishi | |
| 6,593,622 B2 | * | 7/2003 | Kinzer et al. | 257/341 |
| 6,975,513 B2 | * | 12/2005 | Chen et al. | 361/719 |
| 7,112,468 B2 | * | 9/2006 | Chan et al. | 438/109 |
| 2007/0020808 A1 | | 1/2007 | Kalidas et al. | |
| 2008/0142947 A1 | * | 6/2008 | Pan et al. | 257/690 |
| 2009/0051019 A1 | * | 2/2009 | Huang et al. | 257/676 |

FOREIGN PATENT DOCUMENTS

| | | |
|---|---|---|
| DE | 102008029644 A1 | 1/2009 |
| DE | 102008001414 A1 | 10/2009 |
| WO | 2007005263 A3 | 1/2007 |

\* cited by examiner

*Primary Examiner*—Wael M Fahmy
*Assistant Examiner*—Marc Armand
(74) *Attorney, Agent, or Firm*—Infineon Technologies AG Patent Department

(57) ABSTRACT

This application relates to a semiconductor device, the semiconductor device comprising a metal carrier, an insulating foil partially covering the metal carrier, a first chip attached to the metal carrier over the insulating foil, and a second chip attached to the metal carrier over a region not covered by the insulating foil.

25 Claims, 10 Drawing Sheets

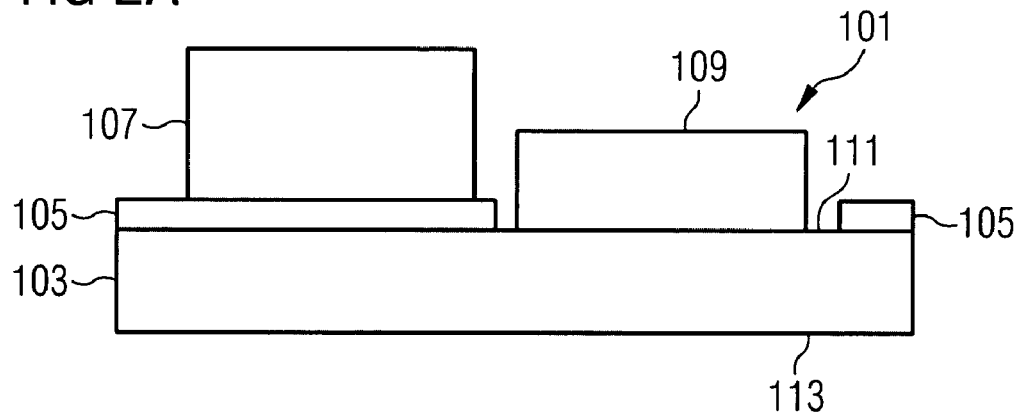
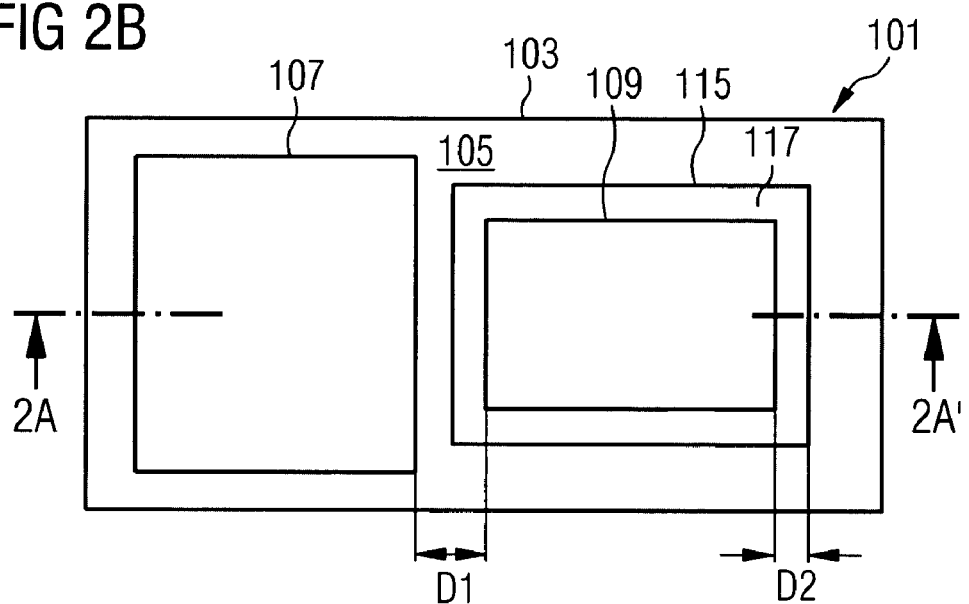
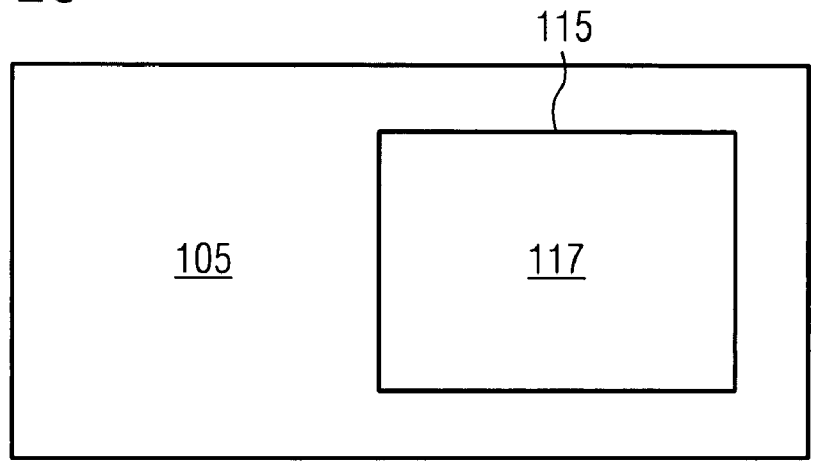

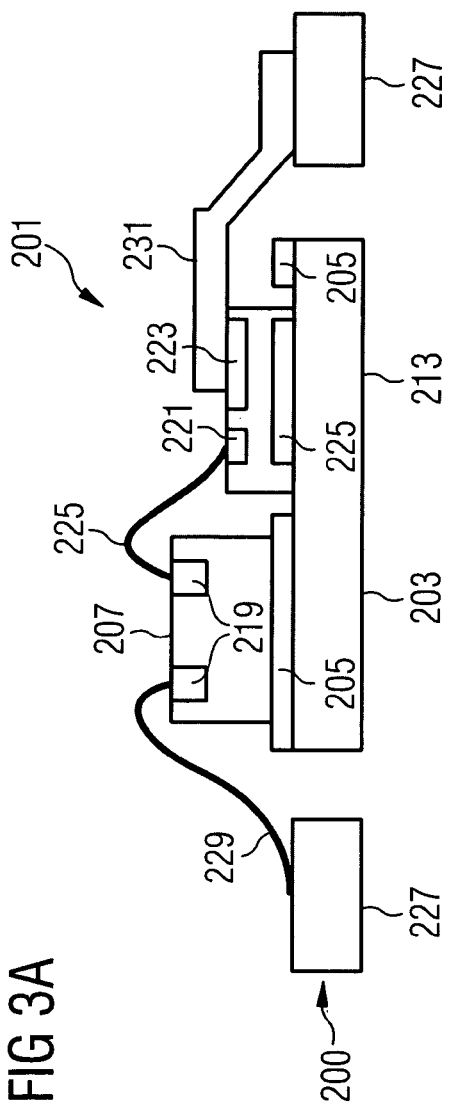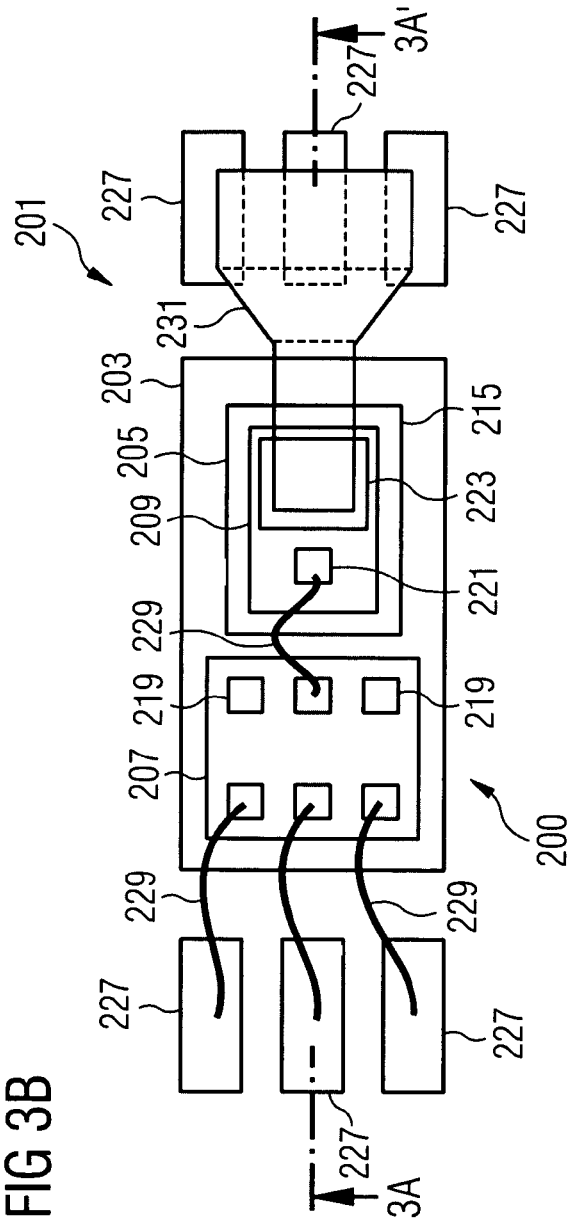
FIG 3A
FIG 3B

ELECTRONIC DEVICE AND METHOD OF MANUFACTURING SAME

FIELD OF THE INVENTION

The present invention relates to a semiconductor device and methods of manufacturing semiconductor devices.

BACKGROUND

In the wake of increasing levels of function integration in semiconductor devices, the number of input/output channels of semiconductor devices has been rising continuously. At the same time, there is a demand to shorten signal channel lengths for high frequency applications, to improve heat dissipation, to improve robustness, and to decrease manufacturing costs. While much progress is being made by improving the design on the semiconductor chip level, many of the aspects above require innovative ways of packaging the chips.

SUMMARY

Accordingly, there is provided a semiconductor device comprising a metal carrier, an insulating foil partially covering the metal carrier, a first chip attached to the metal carrier over the insulating foil, and a second chip attached to the metal carrier over a region not covered by the insulating foil.

BRIEF DESCRIPTION OF THE DRAWINGS

The accompanying drawings are included to provide a further understanding of the present invention and are incorporated in and constitute a part of this specification. The drawings illustrate the embodiments of the present invention and together with the description serve to explain the principles of the invention. Other embodiments of the present invention and many of the intended advantages of the present invention will be readily appreciated as they become better understood by reference to the following detailed description. The elements of the drawings are not necessarily to scale relative to each other. Like reference numerals designate corresponding similar parts.

FIGS. 2A-2C schematically disclose an embodiment of a semiconductor device comprising a metal carrier, and an insulating foil covering the metal layer and comprising an opening.

FIGS. 3A-3B schematically disclose an embodiment of a semiconductor device comprising a leadframe, and an insulating foil covering the leadframe.

DETAILED DESCRIPTION

Although specific embodiments have been illustrated and described herein, it will be appreciated by those of ordinary skill in the art that a variety of alternate and/or equivalent implementations may be substituted for the specific embodiments shown and described without departing from the scope of the present invention. Generally, this application is intended to cover any adaptations or variations of the specific embodiments discussed herein. Therefore, it is intended that this invention be limited only by the claims and the equivalents thereof.

Figure 1A:
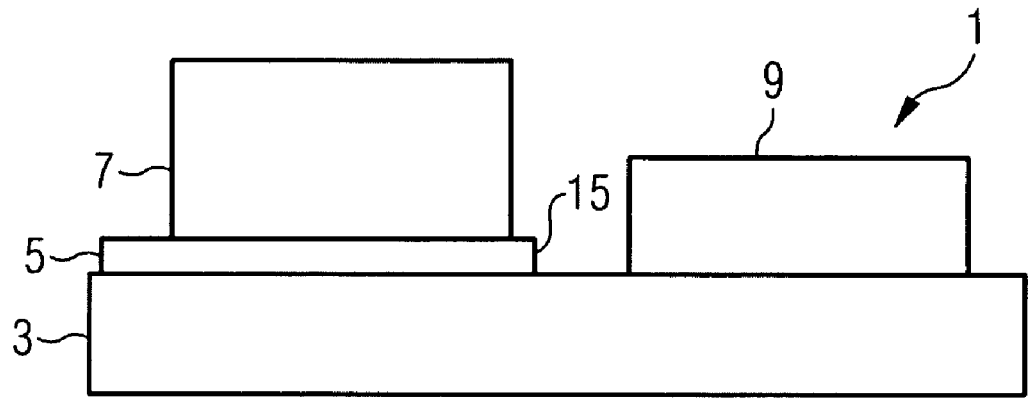
FIGS. 1A-1B schematically disclose an embodiment of a semiconductor device comprising a metal carrier, and an insulating foil partially covering the metal layer.
Figure 1B:
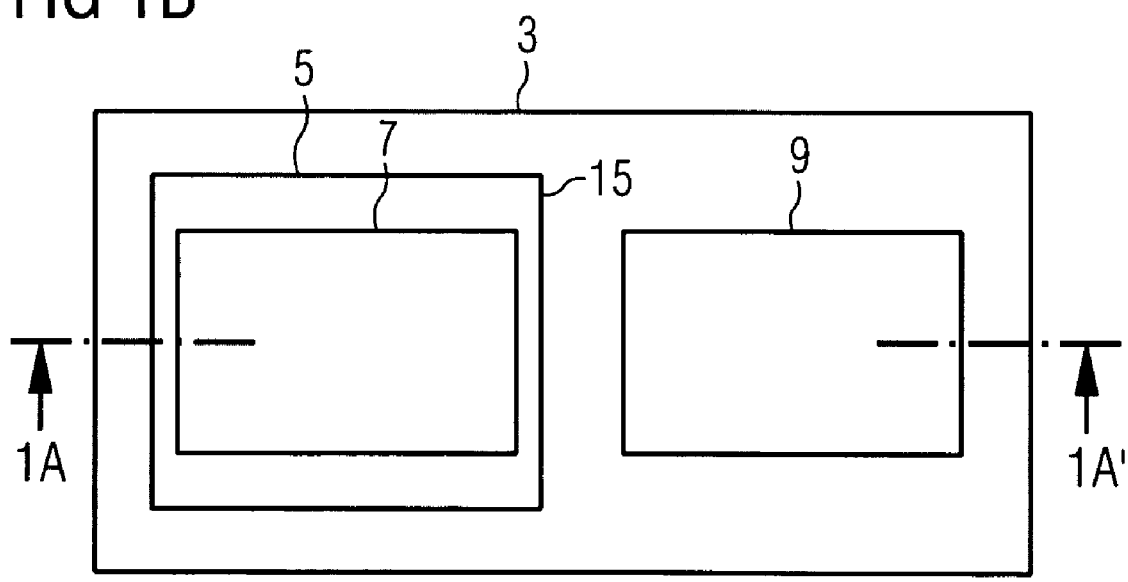

FIGS. 1A and 1B disclose an embodiment of a semiconductor device comprising a metal carrier 3, an insulating foil 5 partially covering the metal carrier, a first chip 7 attached to the metal carrier over the insulating foil, and a second chip 9 attached to the metal carrier over a region not covered by the insulating foil. FIG. 1A discloses a first cross sectional cut through the embodiment along line 1A-1A' shown in FIG. 1B. FIG. 1B discloses a top view on the embodiment.

FIGS. 1A and 1B disclose an insulating foil 5 partially covering the metal carrier 3. With insulating foil 5 partially covering metal carrier 3, first chip 7 and second chip 9 can be attached to the same metal carrier although the substrate of first chip 7 needs to take on a different electric potential than the substrate of second chip 9. For example, with insulating foil 5 partially covering metal carrier 3, the region of metal carrier 3 covered by insulating foil 5 may be used to attach a first chip 7 that needs to be electrically separated from metal carrier 3. On the other hand, the region of metal carrier 3 not covered by insulating foil 5 may be used to attach a second chip 9 whose substrate needs to take on the electric potential of metal carrier 3.

The use of an insulating foil makes it possible to place two or more chips to the same metal carrier even when the substrates of the two or more chips are to be operated at different electric potentials. With the insulating foil, the carrier does not need to be structured or separated for holding different chip at different substrate potentials.

Insulating foil 5 defines a foil rim 15 that separates the regions covered by metal carrier 3 from the regions not covered by metal carrier 3. In one embodiment, the distance between second chip 9 and foil rim 15 may be designed to be smaller than 500 micrometer. In this case, it is possible to place first chip 7 so close to second chip 9 that the minimum lateral distance D1 between the two is 1000 micrometer, or less. A small lateral distance between adjacent chips in a semiconductor device helps to reduce the overall size of a semiconductor device.

The area of insulating foil 5 covering metal carrier 3 is chosen to be larger than the area of first chip 7. This is to make sure that first chip 7 can be securely electrically insulated against metal carrier 3 when attached to metal carrier 3 over insulating foil 5. On the other hand, insulating foil 5 is chosen to be sufficiently small to make sure that the region of metal carrier 3 not covered by insulating foil 5 is large enough for placing second chip 9 on metal carrier 3 directly, i.e. without electrical insulation against metal carrier 3. Put differently, the area of insulating foil 5 may be chosen to be larger than the area of first chip 7 but smaller than the area of metal carrier 3 minus the area of second chip 9.

The use of insulating foil 5 may reduce purchasing and handling costs since the insulating foil can be made of a cheap material, and can be structured easily for adaption to any specific carrier and chip layout. For example, insulating foil 5 may be made of a polymers, like epoxies, acrylates, silicones, polyimides, liquid crystalline polymers, high-temperature hermoplastics or any mixture thereof. The foil can contain any kind of fillers, like $SiO_2$, $Al_2O_3$, PTFE or any kind of additives, like adhesion promoters, or catalyst. In addition, the insulation foil can be easily applied to the metal carrier, or to an array of metal carriers.

In one embodiment, one side of insulating foil 5 is adhesive. This way, insulating foil 5 can be applied to metal carrier 3 by bringing insulating foil 5 in contact with metal carrier 3, or with an array of metal carriers. In one embodiment, both sides of insulating foil 5 are adhesive. This way, first chip 7 can be attached to insulating foil 5 by merely placing first chip 7 on insulating foil 5, without any need to dispense a glue.

The thickness of insulating foil 5 may be chosen according to a given application. Generally, the thickness of insulating foil 5 may be in a range between 5 to 1000 micrometer, depending on the foil material and on the voltage that insulating foil 5 has to withstand during device operation. For lower voltages, a insulating foil thickness of less than 50 micrometer may be sufficient.

In one embodiment, metal carrier 3 may be a chip carrier. In this case, in one embodiment, chip carrier 3 is made of copper, or a copper alloy. In one embodiment, chip carrier 3 may be a plate having a thickness in a range between 10 to 2000 micrometer.

First chip 7 of FIGS. 1A-1B is a semiconductor chip that may comprise for example, an integrated circuit, a microelectromechanical system (MEMS) device, an optical sensor, or a light emitting device, and the like. FIGS. 1A and 1B further disclose a second chip 9 that is a semiconductor chip that may comprise an integrated circuit. In one embodiment, the integrated circuit may comprise one or multiple power transistors.

FIG. 1A further discloses that second chip 9 is attached to metal carrier 3 directly, i.e. in a region not covered by insulating foil 5. Second chip 9 may be, for example, glued, soldered or sintered to metal carrier 3. If glued, the glue may be an electrically conducting glue. The electrically conducting glue may be isotropically or anisotropically conducting. In this case, like for soldering or sintering, the substrate of second chip 9 is electrically directly coupled with metal carrier 3.

In one embodiment, second chip 9 comprises a vertical power transistor, i.e. a power transistor whose load current may flow from the top face to the bottom face of the chip, or vice versa. In this case, metal carrier 3 may serve as external contact element for receiving a load current from, or injecting a load current to, the vertical power transistor of second chip 9.

FIGS. 2A and 2B disclose an embodiment of a semiconductor device that may be similar to the one of FIGS. 1A and 1B. For example, metal carrier 103, first chip 107, and second chip 109 may be the same as the respective metal carrier 3, first chip 7 and second chip 9 of FIGS. 1A and 1B. FIG. 2A is a cross section through the semiconductor device along the line 2A-2A' of FIG. 2B.

Different from FIGS. 1A and 1B, insulating foil 105 comprises an opening 117 with a foil rim 115 forming a closed loop. FIG. 2C illustrates an embodiment of insulating foil 105 foil. In one embodiment, the shape of opening 117 is adapted to the shape of second chip 109 so that the distance D2 between second chip 109 and foil rim 115 is smaller than 200 micrometer in a region between first chip 107 and second chip 109. This way, the distance D1 between first chip 107 and second chip 109 can be kept small.

One or both faces of insulating foil 105 of FIG. 2A-2C may be adhesive so that insulating foil 105 may be applied to metal carrier 103 by merely bringing insulating foil 105 in contact with the surface of metal carrier 103. Further, if insulating foil 105 is adhesive on both faces, first chip 107 may be attached to metal carrier 103 by merely placing first chip 107 on the adhering surface of insulating foil 105.

Second chip 109 may be attached to metal carrier 103 by gluing, soldering or sintering. In one embodiment, the glue is an electrically conducting glue so that second chip 109 is in electrical connection with metal carrier 103.

FIGS. 3A and 3B disclose an embodiment of a semiconductor device that may be similar to the one of FIGS. 2A and 2B. For example, metal carrier 203, first chip 207, and second chip 209 may be similar to, or the same as the respective metal carrier 103, first chip 107 and second chip 109 of FIG. 2A and 2B. FIG. 3A is a cross section through the semiconductor device along the line 2A-2A' of FIG. 3B.

FIGS. 3A and 3B disclose a leadframe 200 that is comprised of metal carrier 203 and six disconnected external contact elements 227. Leadframe 200 is structured such that metal carrier 203 is disconnected from metal carrier 203. Metal carrier 203 may also be known as chip island, or die pad. In other embodiments, leadframe 200 may have more than one chip islands, and more or less than six external contact elements 227.

FIGS. 3A and 3B further disclose a first chip 207 that may be a semiconductor chip with a first integrated circuit (not shown in FIGS. 2A and 2B), and a second chip 209 that may be a semiconductor chip with a second integrated circuit (not shown in FIGS. 2A and 2B). The integrated circuit of first chip 207 may be a logic circuit, e.g. based on CMOS technology, that is coupled to first contact elements 219 located on the top face of first chip 207. In FIGS. 2A and 2B, first chip 207 has six first contact elements 219 of which three are electrically connected to respective three external contact elements 227 with bond wires 229 (connection elements), and one to second chip 209 via a further bond wire 229.

The integrated circuit of second chip 209 may include second contact elements 221, 223, 225. In FIG. 3B, the integrated circuit of second chip 209 includes a power transistor wherein two of the second contact elements are a gate contact 221 and a source contact 223 located on the top face of second chip 209. A further second contact element is drain 225 located on the bottom face of second chip 209. A power transistor with a drain on a first face and a source on a second face of a chip is also known as a vertical transistor due to the load current flowing from one face of the chip to the opposite face of the chip. Alternatively, if the power transistor is a bipolar transistor, gate contact 221 may be a base contact, source contact 223 may be a emitter contact, and drain contact 225 may be a collector contact. Generally, the power transistor may be an MOS power transistor, an insulated gate bipolar transistor (IGBT) or any type of power semiconductor device FIGS. 3A and 3B further disclose a clip 231 (connection element) that electrically connects source 223 (second contact element) with three of the external contact elements 227. Due to its large cross section, in comparison to a bond wire of typical diameters of 15 to 50 micrometer, clip 231 can transmit a large load current through the source of the power transistor of second chip 209. Clip 231 is typically soldered to source 223 and to the external contact elements 227. Note that for a large load current capacity, clip 231 may also be replaced by one or several ribbons, straps, or thick bond wires, e.g. bond wires with a diameter larger than 100 micrometer.

In FIGS. 3A and 3B, first chip 207 and gate 221 of second chip 209 are electrically connected via a further bond wire 229. This bond wire may be used to control the load current between the source and drain of second chip 209 depending on an output voltage provided by the logic circuit of first chip 207. Note that despite first chip 207 and second chip 209 being attached to the same metal carrier 203, due to the electrical insulation provided by insulating foil 205, drain 225 and source 223 of the power transistor of second chip 209 may take on any potential independent of the potential of the substrate of first chip 207.

Figure 4A:
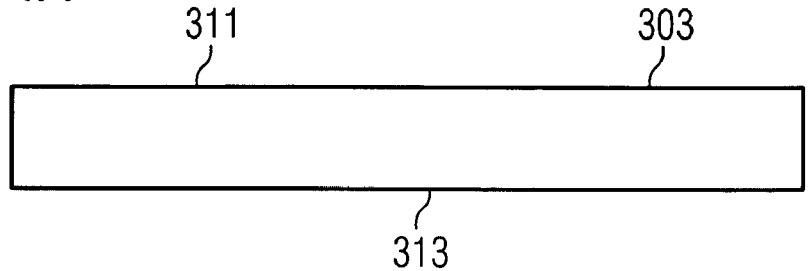
FIGS. 4A-4D schematically disclose an embodiment of a method of manufacturing a semiconductor device comprising wherein the first chip is attached to a metal carrier before the second chip.

FIGS. 4A-4D disclose an embodiment of a method of manufacturing a semiconductor device. FIG. 4A discloses a metal carrier 303 that may be similar to, or the same as the metal carriers 103, 203 shown in the previous figures. Metal carrier 303 defines a first face 311 and a second face 313 opposite to first face 311.

Figure 4B:
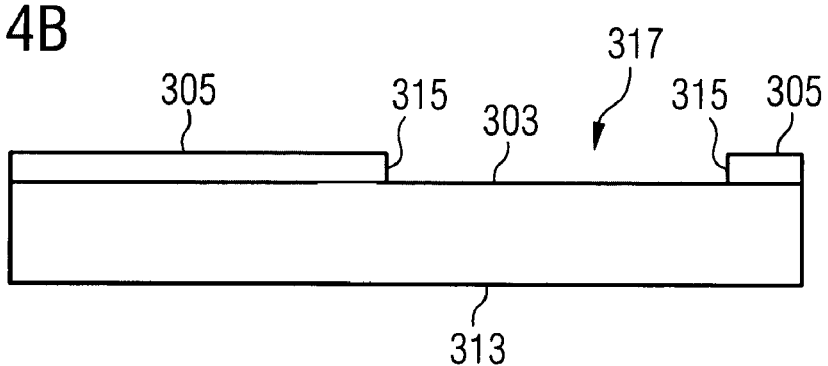

FIG. 4B discloses metal carrier 303 after insulating foil 305 has been applied to first face 311 of metal carrier 303. Insulating foil 305 may have an opening 317 large enough so that second chip 309 can be attached to metal carrier 303 directly (see FIG. 4D). At the same time insulating foil 305 is larger than the area of first chip 307 so that first chip 307 can be placed on the insulating foil 305. If insulating foil 305 has an adhering surface on one or both faces, insulating foil 305 may be applied to metal carrier 303 by merely bringing the adhering faces of insulating foil 305 in contact with the first face 311 of metal carrier 303.

Figure 4C:
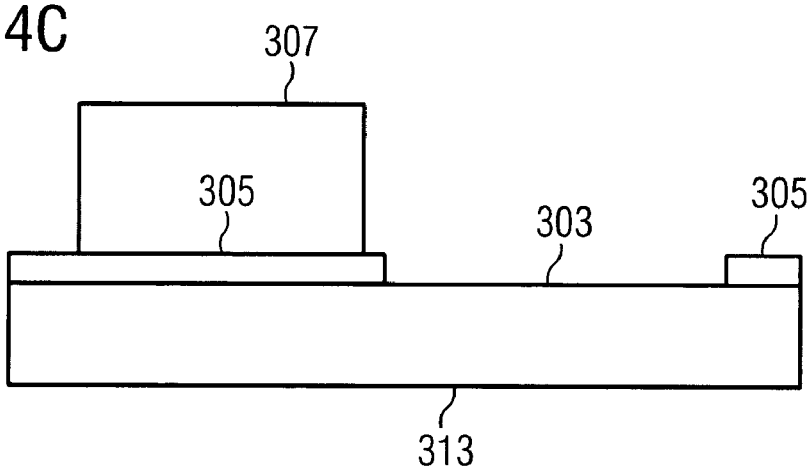

FIG. 4C discloses the metal carrier 303 of FIG. 4B after attachment of first chip 307 to insulating foil 305. First chip 307 may, or may not be the same chip as first chip 207 described in the previous figures. If insulating foil 5 has an adhering surface on its both faces, first chip 307 may be attached to insulating foil 305 by placing the chip on insulating foil 305.

Figure 4D:
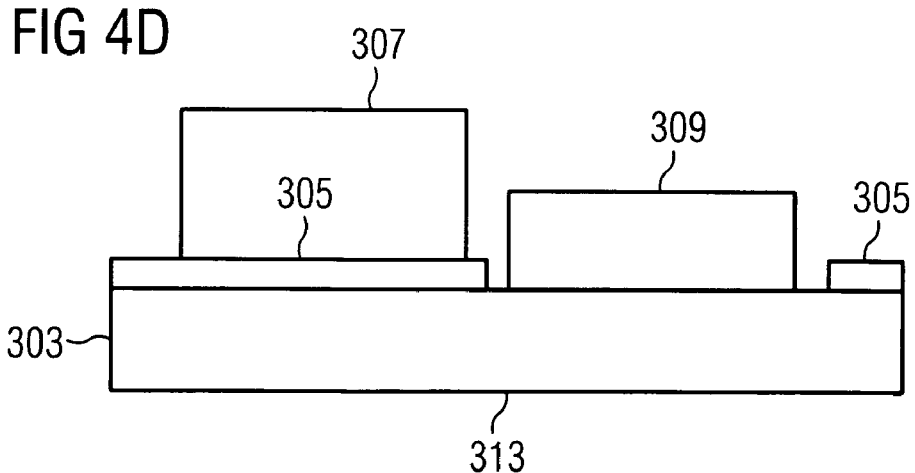
Figure 5A:
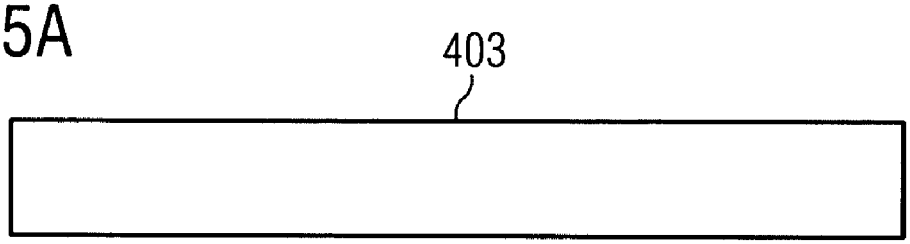
FIGS. 5A-5D schematically disclose an embodiment of a method of manufacturing a semiconductor device wherein the second chip is attached to a metal carrier before the first chip.
Figure 5B:
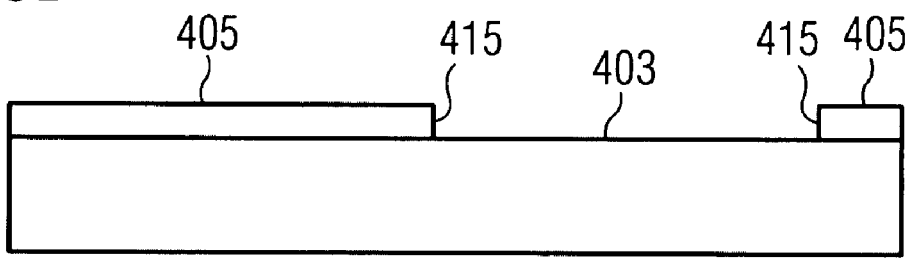
Figure 5C:
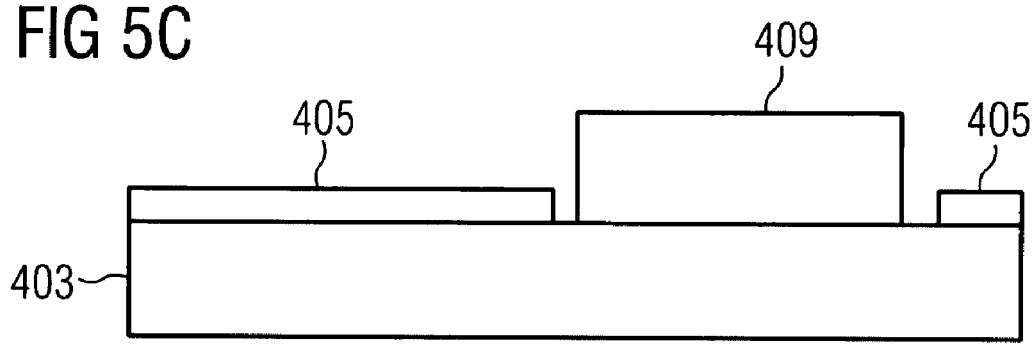
Figure 5D:
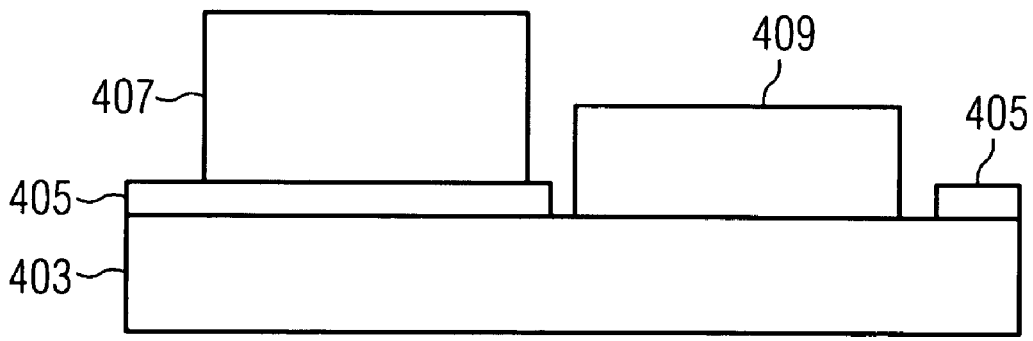
Figure 6A:
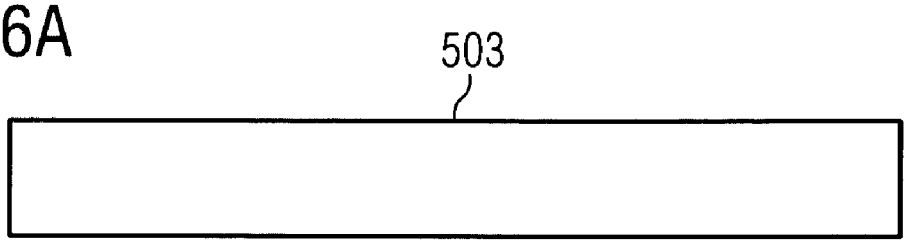
FIGS. 6A-6D schematically disclose an embodiment of a method of manufacturing a semiconductor device wherein the second chip is attached to a metal carrier before applying an insulation foil to the metal carrier.
Figure 6B:
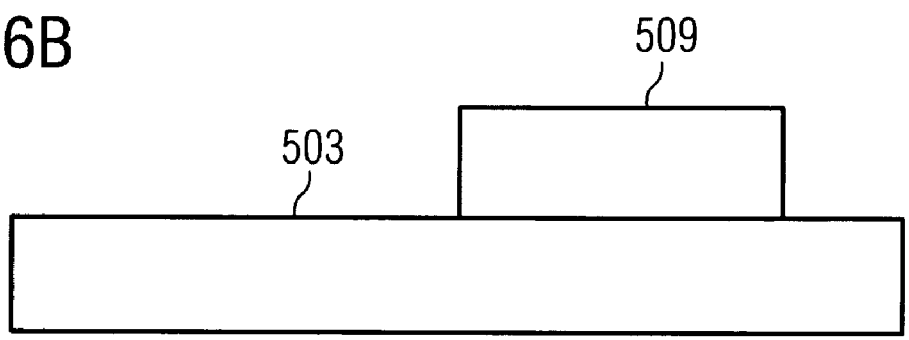
Figure 6C:
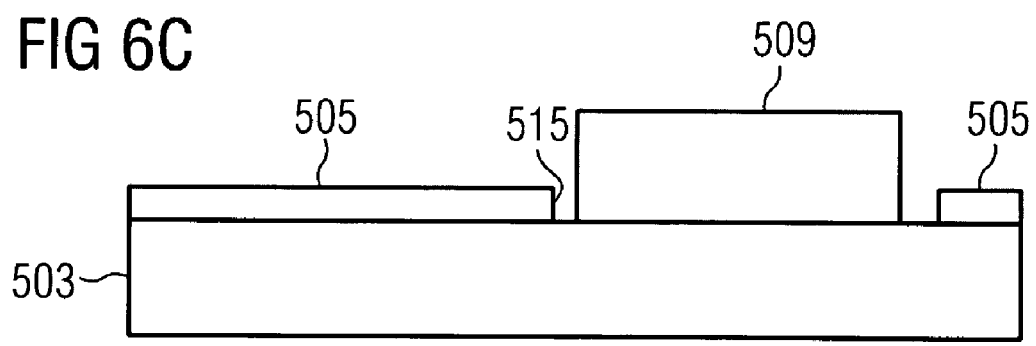
Figure 6D:
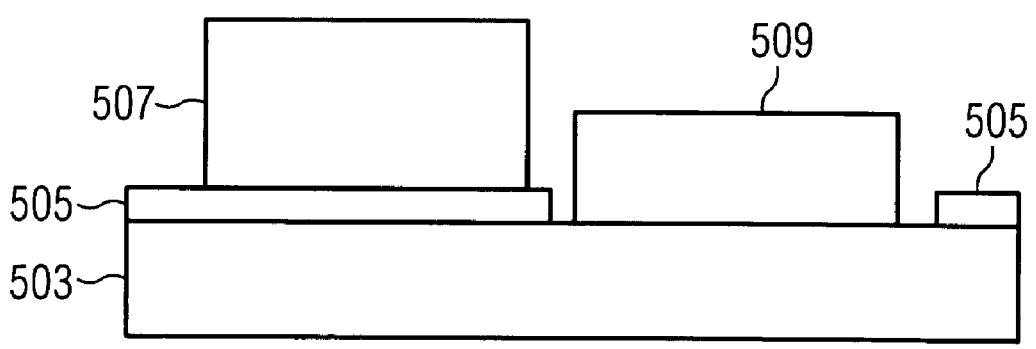

FIG. 4D discloses metal carrier 303 of FIG. 4C after attachment of second chip 309 to metal carrier 303 over the region not covered by insulating foil 305. The attachment can be carried out as described in the previous embodiments. For example, second chip 309 may be soldered, sintered or glued to metal carrier 303 with an electrically conducting glue. If second chip 309 is a power transistor, second chip 309 may also be diffusion soldered to metal carrier 303 as such attachment is robust against the high temperature generated during operation.

FIGS. 5A to 5D disclose an embodiment of manufacturing a semiconductor device which in many respects is similar to the one shown in FIGS. 4A to 4D. For example, metal carrier 403, insulating foil 405, first chip 407 and second chip 409 may be the same as, or similar to metal carrier 303, insulating foil 305, first chip 307 and second chip 309 of FIGS. 4A to 4D. However, different from the embodiment of FIGS. 4A to 4D, second chip 409 is attached to metal carrier 403 prior to first chip 307. This way, first chip 407 is not exposed to the heat that may be produced during the soldering of second chip 409 to metal carrier 403.

FIGS. 6A to 6D disclose an embodiment of manufacturing a semiconductor device which may be the same as, or similar to the one shown in FIGS. 5A to 5D. For example, metal carrier 503, insulating foil 505, first chip 507 and second chip 509 may be the same as or similar to metal carrier 403, insulating foil 405, first chip 407 and second chip 409 of FIGS. 5A to 5D. However, different from the embodiment of FIGS. 5A to 5D, second chip 509 is attached to metal carrier 503 prior to applying insulating foil 505 to metal carrier 503. This way, for example, neither insulating foil 505 nor first chip 507 are exposed to the heat that may be produced during the soldering of second chip 509 to metal carrier 503.

FIGS. 7A to 7G disclose an embodiment of manufacturing a semiconductor device wherein multiple metal carriers 603a, 603b and an insulating foil 605 (FIG. 7C) with multiple openings 617a, 617b, 618a, 618b are provided. The insulating foil 605 is applied to the multiple metal carriers 603a, 603b; further, a first chip 607a, 607b is attached to each of the multiple metal carriers 603a, 603b over the insulating foil; and a second chip 609a, 609b is attached to each of the multiple metal carriers 603a, 603b over one of the multiple openings 617a, 617b of insulating foil 605.

Figure 7A:
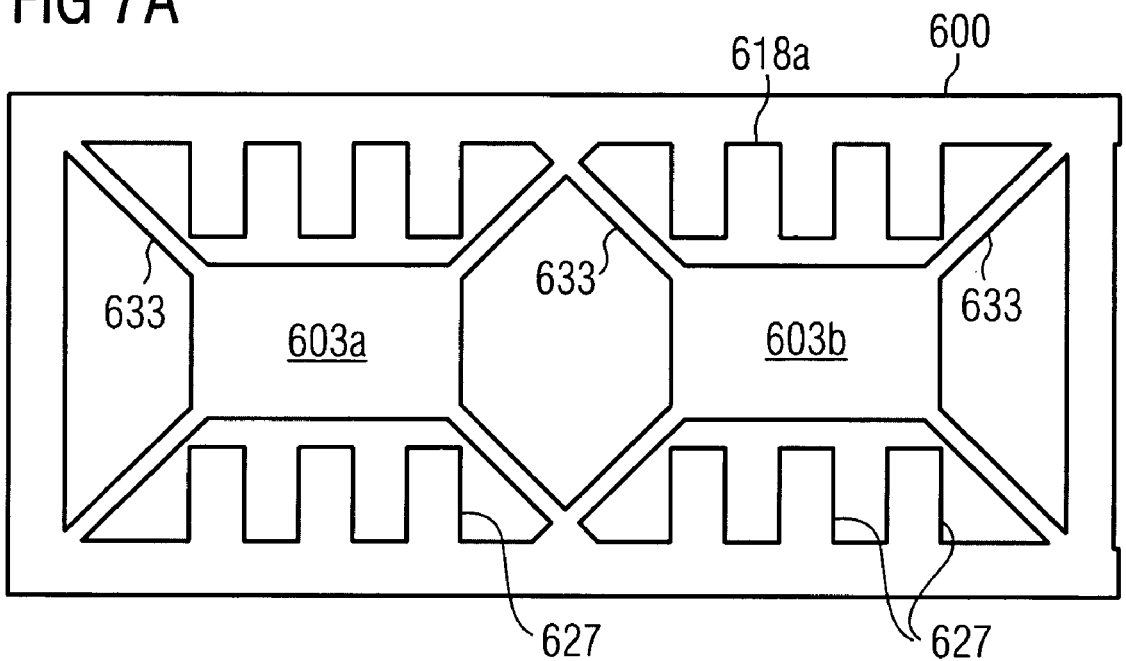
FIGS. 7A-7H schematically disclose an embodiment of a method of manufacturing a semiconductor device wherein multiple first and second chips are attached to a leadframe strip.

FIG. 7A discloses a leadframe strip 600 with two metal carriers 603a, 603b attached to an outer portion of by tie bars 633. Leadframe strip 600 further comprises six external contact elements 627 for each metal carrier 603 that are disconnected from their respective metal carrier 603 but rigidly connected to the outer portion of leadframe strip 600. However, the number of external contact elements 627 and the number of tie bars 633 may widely vary depending on the type and application of the semiconductor device to be manufactured. Generally, leadframe strip 600 may have been produced from a metal or copper sheet, e.g. by stamping, etching or punching. While FIG. 7A discloses a leadframe strip 600 with only two metal carriers, a leadframe strip 600 may have 10, 100 or any other number of metal carriers. The larger the number of metal carriers 603, the larger the number of semiconductor devices that can be produced at the same time from a leadframe strip.

Figure 7B:
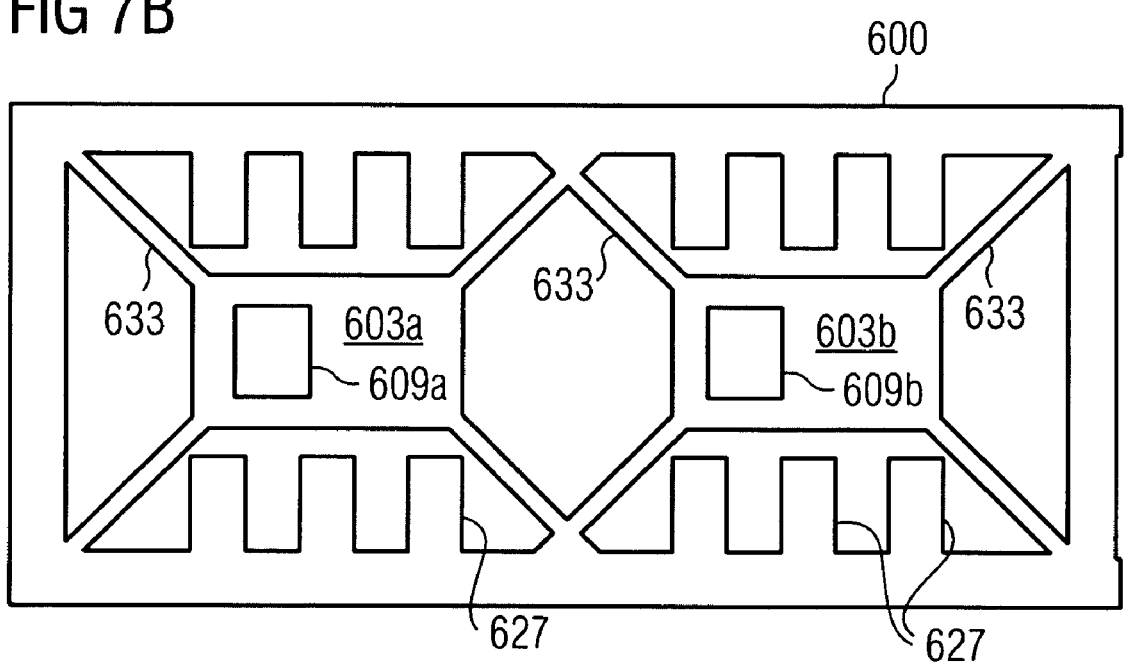

FIG. 7B discloses leadframe strip 600 of FIG. 7A after second chips 609a, 609b have been attached to the surfaces of their respective metal carriers 603a, 603b. The attachment may have been carried out by soldering, in particular diffusion soldering, sintering or gluing with an electrically conducting glue. This way, second chips 609a, 609b are electrically connected with metal carrier 603. In this way, if second chips 609a, 609b include a vertical power transistor, the load electrodes of the second chips 609a, 609b facing the leadframe strip 600 are electrically connected with their respective metal carriers 603a, 603b so that metal carriers 603a, 603b may carry the power transistor current during device operation.

Figure 7C:
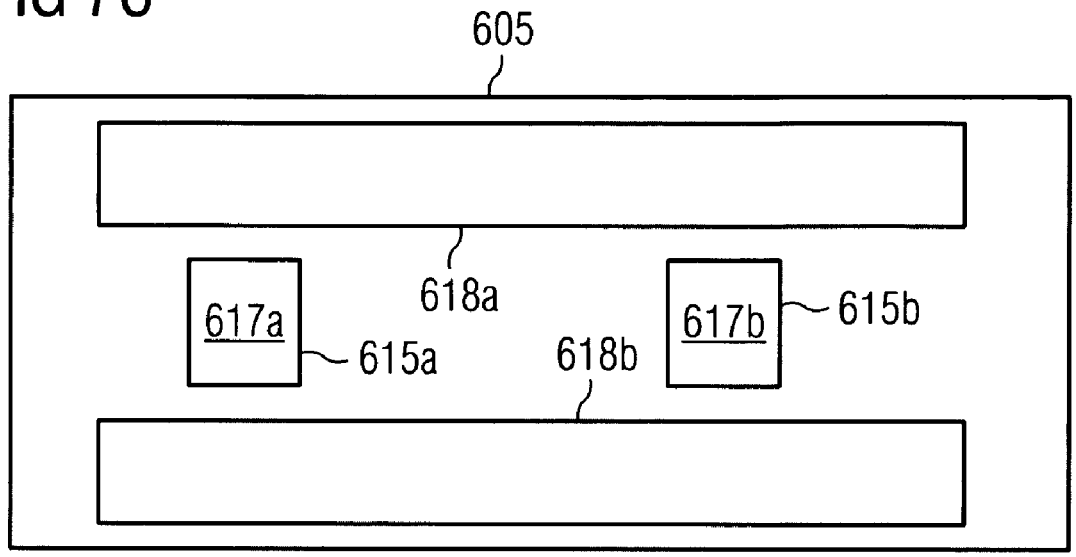
Figure 7D:
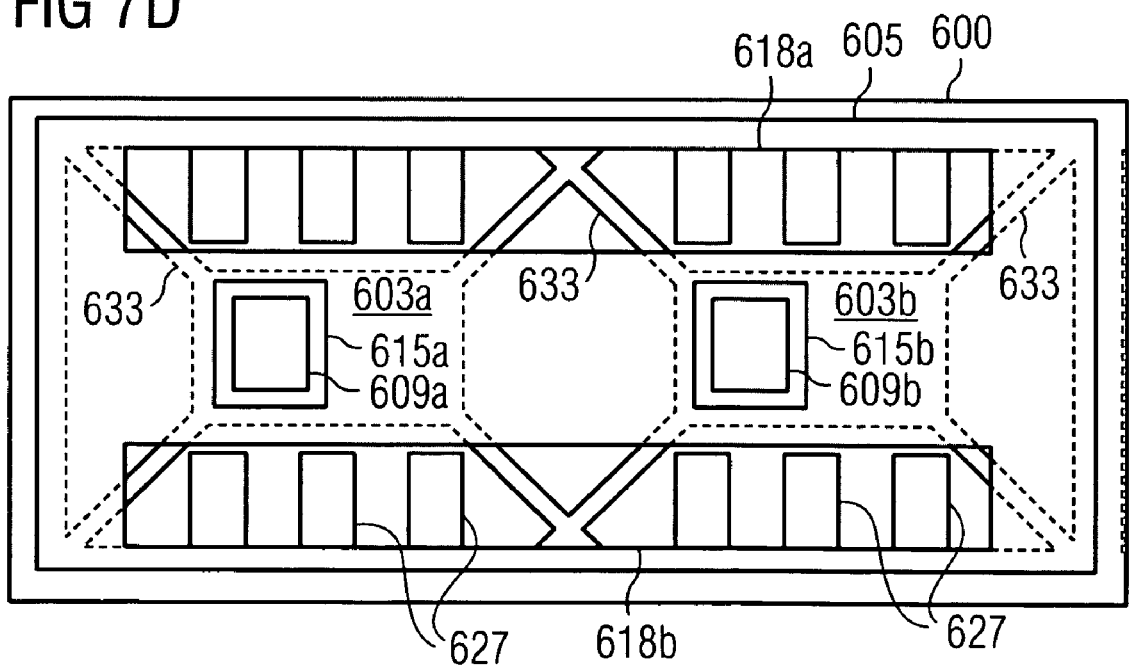

FIG. 7D discloses leadframe strip 600 of FIG. 7B after insulating foil 605, as shown in FIG. 7C, has been applied to leadframe strip 600. In FIG. 7C, insulating foil 605 is shown to be a sheet of a polymer material with two openings 617a, 617b to keep regions of metal carriers 603a, 603b free of insulation, and two openings 618a, 618b to keep the external contact elements 627 free of insulation. The external contact elements 627 are kept free of insulation for being accessible for wire bond connections, and/or for soldering a clip 631 to the external contact elements 227. The size and shape of the two openings 617a, 617b are adapted to the size of the two second chips 609a, 609b so that the foil rims defined by the two openings 617a, 617b surround but do not touch the second chips 609a, 609b. The distance between second chips 609a, 609b and foil rim is typically in the range of 500 micrometer. This way, insulating foil 605 does not cover the second chips 609a, 609b so that the contact elements of second chips 609a, 609b can be accessed for wirebonding, or for clip 231 attachment, etc. The regions of leadframe strip 600 that are covered by insulating foil 605 cannot be seen and are, accordingly, shown as dotted lines.

Figure 7E:
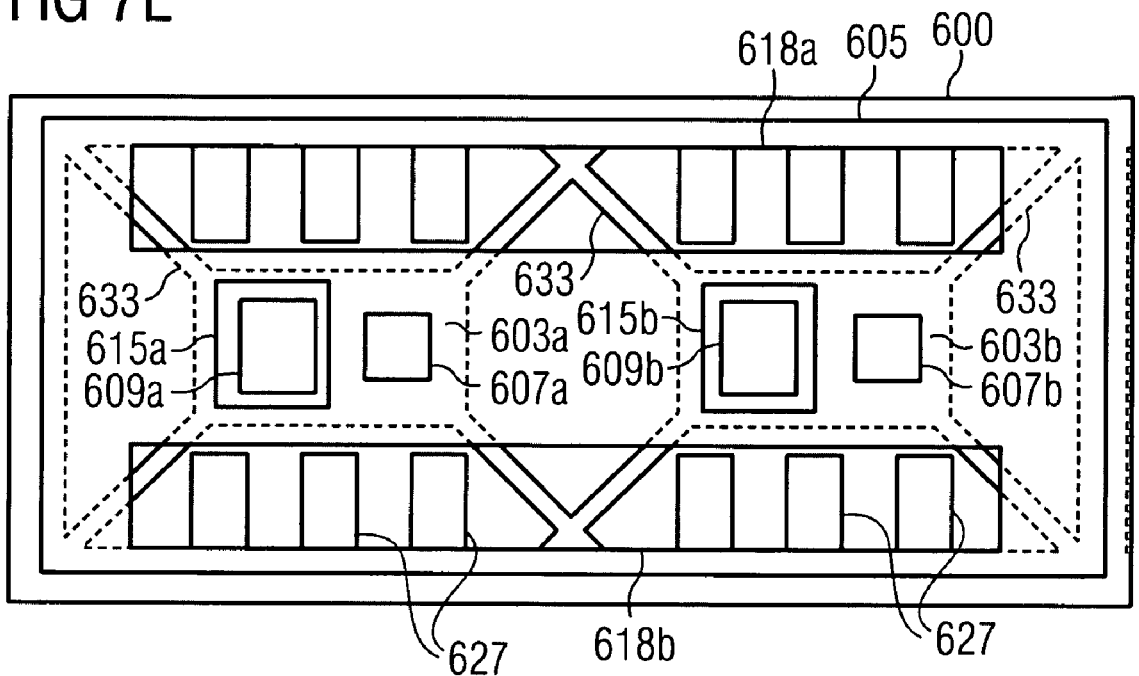

FIG. 7E discloses leadframe strip 600 of FIG. 7D after first chips 607a, 607b are attached to their respective metal carriers 603a, 603b in a region that is covered by insulating foil 605. If insulating foil 605 is made of a sheet that is adherent on both sides, the attachment of first chips 607 to metal carriers 603a, 603b is made by pressing the first chips 607a, 607b onto insulating foil 605. Otherwise, first chips 607a, 607b may be glued to insulating foil 605 with a separate glue dispensed in the specified regions.

Figure 7F:
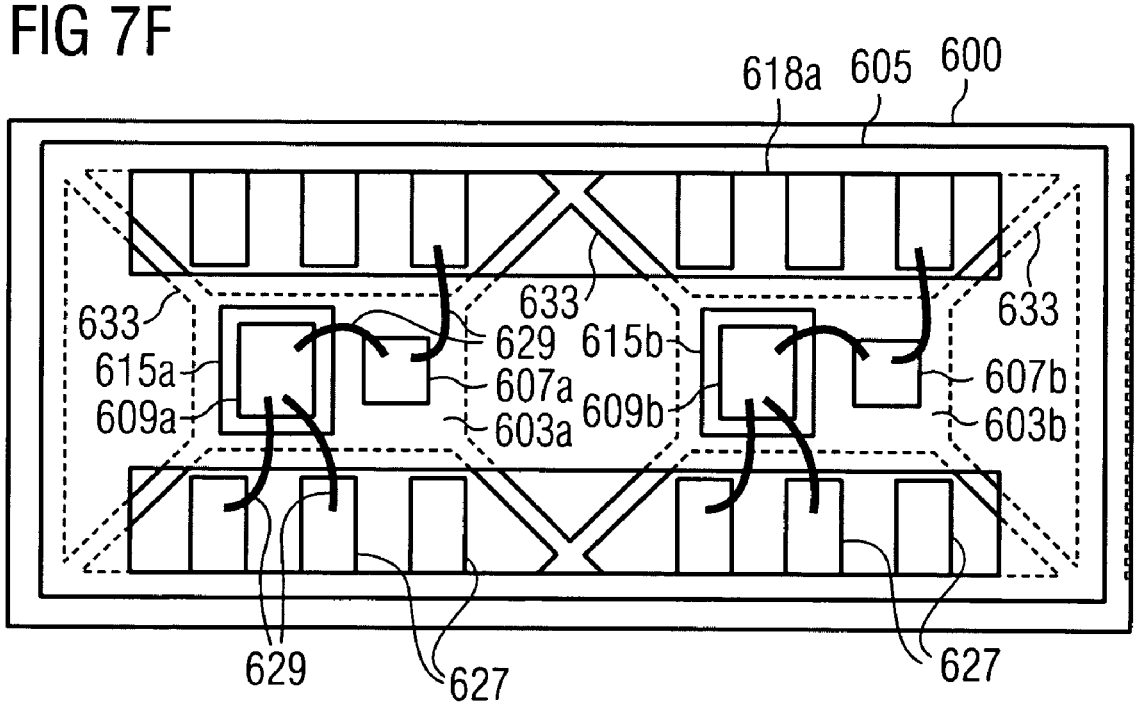

FIG. 7F discloses leadframe strip 600 of FIG. 7E after bond wires 629 have been wire bonded to electrically connect second chips 609a, 609b with their respective two external contact elements 627, and first chips 607a, 607b with their respective external contact elements 627. In addition, a bond wire is wire bonded from the each of the first chips 607a, 607b to their respective second chips 609a, 609b. Due to the openings in insulating foil 605, the surfaces of the external contact elements 227 are exposed so that the bond wires 629 can be welded to the external contact elements 627, e.g. by ultrasonic welding.

Figure 7G:
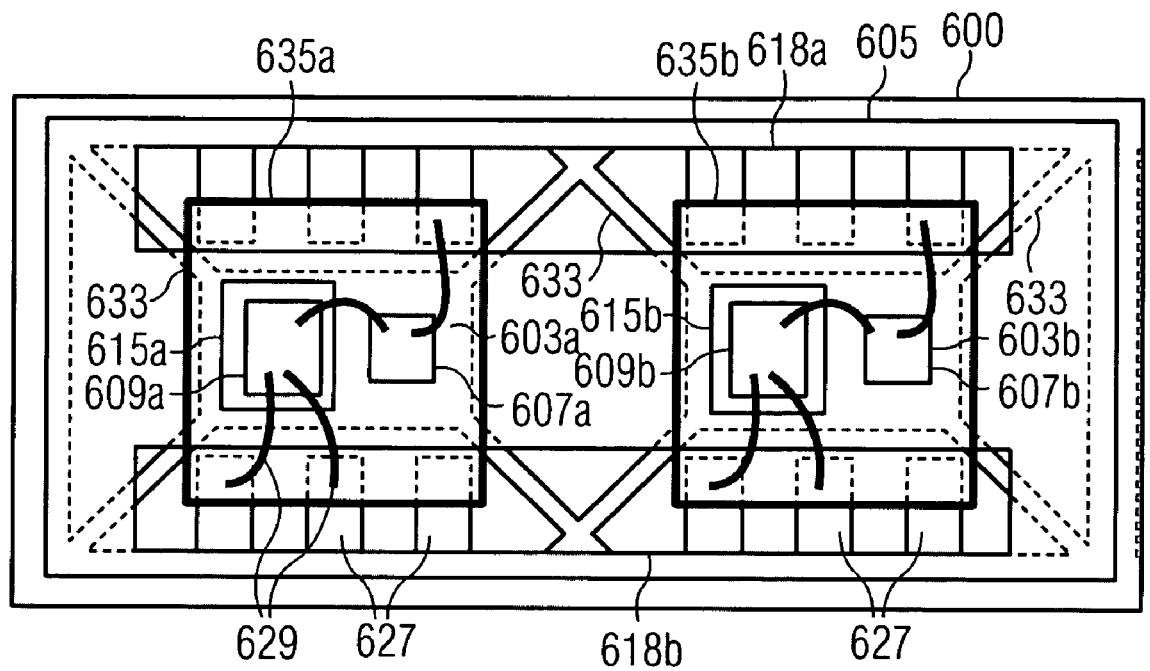

FIG. 7G discloses leadframe strip 600 after leadframe strip 600 has been molded in a mold compound. The molding may be done in traditional ways, eg. by placing the leadframe strip 600 of FIG. 7F into a mold and filling the mold with a liquid mold compound that hardens after cool down. As can be seen in FIG. 7G, the mold has formed two squared molded bodies 635a, 635b that each encapsulate one respective first and second chip 607a, 607b, 609a 609b, one respective metal carrier 603a, 603b, the bond wires 629, and the external contact elements 627. At the same time, the surfaces of the metal carriers 603a, 603b and external contact elements 627 opposite to the surfaces facing the first and second chips 607a, 607b, 609a, 609b are kept free of the molding compound. This way, the surfaces can be soldered to a board, e.g. a printed circuit board (PCB).

Figure 7H:
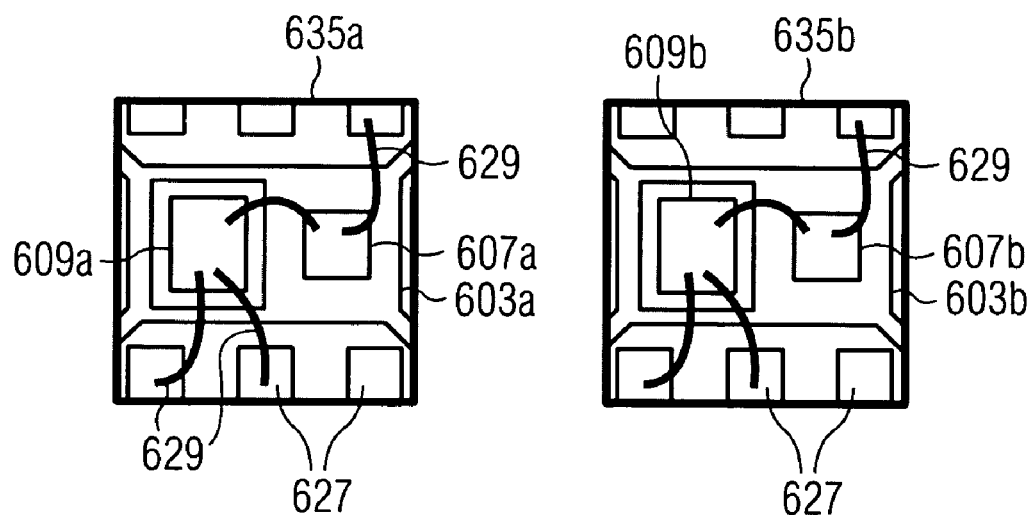

FIG. 7H discloses the molded leadframe strip 600 of FIG. 7G after leadframe strip 600 has been cut (singulated). By cutting the leadframe strip 600, the external contact elements 627 and the tie bars 633 are separated from the outer portions of leadframe strip 600. This way, it is the molded bodies 635a, 635b that hold their respective metal carriers 603a, 603b, and their respective external contact elements 627 in place.

While a particular feature or aspect of an embodiment of the invention may have been disclosed with respect to only one of several implementations, such feature or aspect may be combined with one or more other features or aspects of the other implementations as may be desired and advantageous for any given or particular application. Furthermore, to the extent that the terms "include", "have", "with", or other variants thereof are used in either the detailed description or the claims, such terms are intended to be inclusive in a manner similar to the term "comprise". The terms "coupled" and "connected", along with derivatives may have been used. It should be understood that these terms may have been used to indicate that two elements co-operate or interact with each other regardless whether they are in direct physical or electrical contact, or they are not in direct contact with each other. Furthermore, it should be understood that embodiments of the invention may be implemented in discrete circuits, partially integrated circuits or fully integrated circuits or programming means. Also, the term "exemplary" is merely meant as an example, rather than the best or optimal. It is also to be appreciated that features and/or elements depicted herein are illustrated with particular dimensions relative to one another for purposes of simplicity and ease of understanding, and that actual dimensions may differ substantially from that illustrated herein.

What is claimed is:

1. A semiconductor device, comprising:
   a metal carrier;
   an insulating foil partially covering the metal carrier;
   at least two chips disposed over the metal carrier, wherein
      a first chip of the at least two chips is attached to the metal carrier over the insulating foil; and
   wherein a second chip of the at least two chips is attached to the same metal carrier and is disposed over a region not covered by the insulating foil, wherein the insulating foil surrounds the entire second chip.

2. The semiconductor device according to claim 1 wherein the minimum lateral distance along the metal carrier between the first chip and the second chip is smaller than 1000 micrometer.

3. The semiconductor device according to claim 1 wherein the insulating foil has an opening comprises a foil rim surrounding the second chip, and wherein the distance between the second chip and the foil rim is less than about 200 mm.

4. The semiconductor device according to claim 1 wherein the second chip is attached to the metal carrier by at least one of soldering, sintering or an electrically conductive adhesive.

5. The semiconductor device according to claim 1 wherein the first chip comprises first contact elements and the second chip comprises second contact elements.

6. The semiconductor device according to claim 1 wherein the second chip comprises a power transistor.

7. The semiconductor device according to claim 1 wherein the insulating foil has a thickness in a range between 10 to 1000 micrometer.

8. The semiconductor device according to claim 1 wherein the insulating foil has a thickness in a range between 10 to 100 micrometer.

9. The semiconductor device according to claim 5 further comprising multiple external contact elements and connection elements connecting the first and second contact elements with the external contact elements.

10. The semiconductor device according to claim 9 wherein the connection elements are each at least one of a bond wire, a bond ribbon, a clip and a structured film element.

11. The semiconductor device according to claim 9 further comprising a clip connecting one of the second contact elements with one of the external contact elements.

12. The semiconductor device according to claim 9 further comprising a mould compound encapsulating at least one of the first chip, the second chip, the carrier, and the external contact elements.

13. A semiconductor device, comprising:
   a leadframe comprising a metal carrier and external contact elements, the metal carrier having at least two chips;
   an insulating foil comprising an opening, the insulating foil covering the carrier;
   a first chip of the at least two chips is attached to the same metal carrier over the insulating foil; and
   a second chip of the at least two chips is attached to the metal carrier and is disposed in the opening of the insulating foil, wherein the insulating foil surrounds the entire second chip.

14. A method of manufacturing a semiconductor device, comprising:
   providing a metal carrier;
   attaching a first chip to the metal carrier by at least one of soldering, sintering and means of electrically conducting glue;
   applying an insulating foil over the metal carrier surrounding an opening in which the entire first chip is applied;
   attaching a second chip the insulating foil.

15. The method according to claim 14 wherein the opening comprises a foil rim surrounding the first chip.

16. The method according to claim 14 further comprising encapsulating at least one of the first chip, the second chip and the metal carrier with a moulding compound.

17. The method according to claim 14 wherein the insulating foil is an adhesive insulating foil.

18. The method according to claim 14 wherein the insulating foil is adhesive on both sides.

19. The method according to claim 14 wherein the insulating foil comprises at least one of a polymers, epoxies, acrylates, silicones, polyimides, liquid crystalline polymers and high-temperature thermoplastics.

20. The method according to claim 15 wherein the shape of the opening is adapted to the shape of the first chip and wherein the distance between the foil rim and the first chip is less than about 200 mm.

21. A method of manufacturing a semiconductor device, comprising:
   providing multiple metal carriers;
   attaching a first chip to each of the multiple metal carriers;
   providing a insulating foil with multiple openings;
   applying the insulating foil to the multiple metal carriers with the multiple openings surrounding the entire first chip of each of the multiple metal carriers; and
   attaching a second chip to the insulating foil.

22. The method according to claim 21 wherein the respective first chip is attached to the metal carriers by at least one of soldering, sintering, and electrically conducting glue.

23. The method according to claim 21 further comprising encapsulating the respective first chips, the respective second chips and the respective multiple metal carriers with a mold compound.

24. The method according to claim 21 further comprising singulating the multiple metal carriers from each other after the attachment of the respective first chip and the respective second chip to the multiple metal carriers.

25. A method of manufacturing a semiconductor device, comprising:
   providing multiple leadframes, each leadframe comprising a metal carrier and external contact elements;
   attaching a first chip to each of the metal carriers by at least one of soldering, sintering, and means of electrically conducting glue;
   providing an adhesive insulating foil with multiple openings;
   applying the adhesive insulating foil to the multiple leadframes with the multiple openings surrounding the entire first chip of each of the metal carriers; and
   attaching a second chip to the adhesive insulating foil.

* * * * *

UNITED STATES PATENT AND TRADEMARK OFFICE
CERTIFICATE OF CORRECTION

| | | |
|---|---|---|
| PATENT NO. | : 7,847,375 B2 | Page 1 of 1 |
| APPLICATION NO. | : 12/185829 | |
| DATED | : December 7, 2010 | |
| INVENTOR(S) | : Mahler et al. | |

It is certified that error appears in the above-identified patent and that said Letters Patent is hereby corrected as shown below:

Column 8 line 58, Claim 14, the text should read "attaching a second chip --to-- the insulating foil".

Signed and Sealed this
Eighth Day of February, 2011

David J. Kappos
*Director of the United States Patent and Trademark Office*